United States Patent
Appelberg et al.

(10) Patent No.: US 11,004,591 B2
(45) Date of Patent: May 11, 2021

(54) MULTILAYER TRANSFORMER STRUCTURE COMPRISING MULTIPLE RECTIFICATION ELEMENTS

(71) Applicant: Flex Ltd., Singapore (SG)

(72) Inventors: Mikael Appelberg, Farjestaden (SE); Oscar Persson, Kalmar (SE); Magnus Karlsson, Oskarshamn (SE); Qiuhong Wang, Stockholm (SE)

(73) Assignee: Flex Ltd., Singapore (SG)

( * ) Notice: Subject to any disclaimer, the term of this patent is extended or adjusted under 35 U.S.C. 154(b) by 0 days.

(21) Appl. No.: 16/387,301

(22) Filed: Apr. 17, 2019

(65) Prior Publication Data

US 2020/0335255 A1    Oct. 22, 2020

(51) Int. Cl.
| | |
|---|---|
| *H05K 7/00* | (2006.01) |
| *H01F 27/28* | (2006.01) |
| *H01F 27/40* | (2006.01) |
| *H05K 1/18* | (2006.01) |

(52) U.S. Cl.
CPC ......... *H01F 27/2804* (2013.01); *H01F 27/40* (2013.01); *H05K 1/182* (2013.01); *H01F 2027/2809* (2013.01); *H01F 2027/408* (2013.01); *H05K 2201/1003* (2013.01); *H05K 2201/10166* (2013.01)

(58) Field of Classification Search
USPC .......................................................... 361/782
See application file for complete search history.

(56) References Cited

U.S. PATENT DOCUMENTS

| | | | |
|---|---|---|---|
| 9,697,947 B1 * | 7/2017 | Luzanov | ................ H05K 1/141 |
| 2003/0032422 A1 | 2/2003 | Wynbeek | |
| 2007/0058406 A1 | 3/2007 | Inoshita | |
| 2007/0263415 A1 | 11/2007 | Jansen | |
| 2010/0284203 A1 | 11/2010 | Moussaoui | |
| 2015/0155669 A1 | 6/2015 | Chamberlain | |
| 2018/0164355 A1 | 6/2018 | Winkler | |

OTHER PUBLICATIONS

First action dated Apr. 29, 2020, Chinese Patent Application No. 2018108146828, Applicant: Flextronics AP, LLC., 23 pages.
English Translation of the Second Office Action Application No. 201810814682.8, Applicant: Flextronics AP, LLC.,24 pages.

* cited by examiner

*Primary Examiner* — Andargie M Aychillhum
(74) *Attorney, Agent, or Firm* — Haverstock & Owens LLP

(57) ABSTRACT

A power conversion circuit has a multilayer transformer and a plurality of rectifying transistors coupled to the secondary windings of the multilayer transformer. The multilayer transformer is formed as multiple layers within a PCB stack, where primary winding conductors and secondary winding conductors are vertically aligned and stacked. The secondary winding conductors are constructed to have one or more secondary winding arms that provide area to which the plurality of rectifying transistors are physically connected. The primary winding conductors are constructed to have a primary winding arm. A footprint of each primary winding conductor is configured to substantially overlap an entire footprint of each of the secondary winding conductors. As such, an entirety of the secondary current flowing through the secondary winding conductors is vertically aligned with the primary winding conductors, and therefore with the primary current flowing through the secondary winding conductors.

13 Claims, 13 Drawing Sheets

MULTILAYER TRANSFORMER STRUCTURE COMPRISING MULTIPLE RECTIFICATION ELEMENTS

FIELD OF THE INVENTION

The present invention is generally directed to the field of multilayer transformers. More specifically, the present invention is directed to a multilayer transformer structure comprising multiple rectification elements.

BACKGROUND OF THE INVENTION

The evolution of mainly datacenters has led to an exponential increase in the power density of power converters. This have been enabled by a rapid evolution of mainly MOSFET performance, which has enabled extreme output power in very small form factors. To match this development and to enable increasing the power density, further optimization must be made to the transformer in transformer-based designs used in power converters.

A transformer structure can be integrated as part of a multilayer printed circuit board by having each "coil" in the transformer represented as a coil shaped conductor patterned on a different layer of the PCB, each coil shaped conductor corresponds to a winding, or turn, of either the primary winding or the secondary winding of the transformer. The coil shaped conductors corresponding to windings of the primary winding are interconnected by a first set of vias and the coil shaped conductors corresponding to the secondary winding are interconnected by a second set of vias. The coil shaped conductors are positioned on each layer of the PCB stack so as to be vertically aligned with each other in the stack. The resulting structure is referred to as a multilayer transformer.

In some applications, a circuit board is configured as a power converter and select secondary windings are connected to different voltage rails in the power converter circuit via rectifying transistors, such as MOSFETs. The rectifying transistors are necessary for providing DC power to an attached load. In many applications, a multitude of rectifying transistors are needed to handle the required amount of current. The larger the current, the greater the number of rectifying transistors is needed. The number of rectifying transistors are also dependent on multiple other factors including the output voltage, the MOSFET design and package, and a target application load profile.

When operating at high frequencies, for example greater than or equal to 200 KHz, there are significant skin effects and eddy current effects associated with the conductor windings in the multilayer transformer. Skin effect in this case is the tendency of an alternating electric current (AC) to become distributed within a conductor such that the current density is largest near the outer perimeter edge of the conductor that forms the winding at any layer within the multilayer transformer, and decreases moving inward from the conductor outer perimeter edge. These effects result in current flow concentrating within certain sections of the winding conductor, while less current flows through other sections of the winding conductor.

Typically, these effects are minimized by configuring the power converter circuit to have the primary current flowing in one direction and the secondary current flowing in an opposite direction, which is seen in a typical transformer configuration. FIG. 1 illustrates a schematic diagram of an exemplary conventional power converter circuit. The schematic shows four groups of rectifying transistors on the output side of the power converter circuit, each group including four individual transistors. Specifically, the power converter circuit includes rectifying transistors T400, T414, T420, T424, T401, T417, T421, T427 coupled to secondary winding terminal TRMSA of a transformer M300, and rectifying transistors T402, T415, T422, T425, T403, T416, T423, T426 coupled to secondary winding terminal TRMSB of the transformer M300. Rectifying transistors T400, T414, T420, T424 are grouped together as a first group and are configured in parallel between the secondary winding terminal TRMSA and a high voltage rail +OUTB. Rectifying transistors T402, T415, T422, T425 are grouped together as a second group and are configured in parallel between the secondary winding terminal TRMSB and the high voltage rail +OUTB. Rectifying transistors T401, T417, T421, T427 are grouped together as a third group and are configured in parallel between the secondary winding terminal TRMSA and a ground rail. Rectifying transistors T403, T416, T423, T426 are grouped together as a fourth group and are configured in parallel between the secondary winding terminal TRMSB and the ground rail.

The output side of the power converter also includes capacitors C489, C473, C490, C472, C474, C491, C475, C463-470, C476-478, resistors R470, R471, inductor M400, and rectifying transistor drivers N419, N409. The rectifying transistor drivers N419, N409 buffer and increase the drive capability of driving signals provided from a controller (not shown) for the rectifying transistors. The output voltage is provided at terminal +OUT.

An input DC power is supplied at terminals +IN and −IN at an input side of the power converter circuit. The input side includes capacitors C1-C9, C12, C13, C48, C49, inductor Ml, transistors T1-T4, and transistor drivers N420, N421. The transistors T1-T4 can be MOSFETs or other conventional switching devices. The transistor drivers N420, N421 buffer and increase the drive capability of driving signals provided from a controller (not shown) for the transistors T1-T4.

In operation, the power converter circuit receives an input DC voltage. The transistors T1-T4 are pulse width modulated so that a quasi-square voltage waveform is input to the primary winding of the transformer M300. The quasi-square voltage waveform alternates between a positive voltage pulse and a negative voltage pulse and is considered an AC voltage. Different modulation schemes can be applied. In one scheme, the transistors T1 and T4 are turned ON while the transistors T2 and T3 are turned OFF to drive current in one direction, for example negative primary current and positive secondary current, and the transistors T2 and T3 are turned ON while the transistors T1 and T4 are turned OFF when driving current in another direction, for example positive primary current and negative secondary current, which is collectively considered as AC current. When the transistors T1 and T4 are turned ON, and the transistors T2 and T3 are turned OFF, a primary current flows from the positive rail +PWR, through the transistor T1, through the primary winding of transformer M300, through the transistor T4, to the negative rail −IN, as shown in primary current path 1. During the same time period, the rectifying transistors T400, T414, T420, T424, T403, T416, T423, T426 are turned ON, and the rectifying transistors T402, T415, T422, T425, T401, T417, T421, T427 are turned OFF, which results in a secondary current flow induced at the secondary winding of the transformer M300 to flow through the rectifying transistors T400, T414, T420, T424, through the inductor M400, through the capacitors C463, C464, C465, C466, C467, C468, C469, C470, C476, C477, C478 and any connected load, through the rectifying transistors T403, T416, T423, T426, and back to the secondary winding, as shown in the secondary current path 2.

When the transistors T1 and T4 are turned OFF, and the transistors T2 and T3 are turned ON, a primary current flows from the positive rail +PWR, through the transistor T3, through the primary winding of transformer M300, through the transistor T2, to the negative rail −IN, as shown in primary current path 3. During this same time period, the rectifying transistors T400, T414, T420, T424, T403, T416, T423, T426 are turned OFF, and the rectifying transistors T402, T415, T422, T425, T401, T417, T421, T427 are turned ON, which results in a secondary current flow induced at the secondary winding of the transformer M300 to flow through the rectifying transistors T401, T417, T421, T427, through the capacitors C463, C464, C465, C466, C467, C468, C469, C470, C476, C477, C478 and any connected load, through the inductor M400, through the rectifying transistors T402, T415, T422, T425, and back to the secondary winding, as shown in the secondary current path 4.

The physical structure of the power converter circuit is implemented as a multilayer PCB. The capacitors, resistors, controller chips are mounted to a top and/or bottom side of the PCB, and the multilayer transformer is implemented as interleaved primary and secondary winding conductor layers in the PCB stack. The PCB includes patterned conductive interconnects and interconnect vias for appropriately interconnecting the various components and layers. Losses in multilayer transformers can be further reduced by minimizing the interconnect conductor length between the secondary winding conductors and the rectifying transistors. This has been addressed by moving the connection between each rectifying transistor and the secondary winding conductor to the winding conductor itself. In particular, the physical positioning of each rectifying transistor is such that the rectifying transistor is aligned over an outer perimeter edge of the secondary winding conductors in the PCB stack. FIG. 2 illustrates a top down view of one of the layers in the conventional PCB that includes a primary winding conductor. FIG. 3 illustrates a top down view of one of the layers in the conventional PCB that include a secondary winding conductor. The actual number of layers in the PCB that include a secondary winding conductor and the number of layers that include a primary winding conductor are dependent on the turns ratio of the multilayer transformer. As shown in FIG. 2, the primary winding conductor 2 is circularly shaped. The primary winding conductor 2 is discontinuous at a break 4, which substantially forms two ends of the primary winding conductor 2. Each end is connected to another end of another primary winding conductor on another layer of the PCB. The ends of two primary winding conductors on different layers are interconnected by interconnect vias. For example, one end of the primary winding conductor 2 can be connected to next higher primary winding conductor in the PCB stack by interconnect vias 6, and another end of the primary winding conductor 2 can be connected to next lower primary winding conductor in the PCB stack by interconnect vias 8.

As shown in FIG. 3, the secondary winding conductor 12 includes secondary winding conductor arms 14 and 16 that extend from a circularly shaped base. Similar to the primary winding conductor, the secondary winding conductor 12 is discontinuous at a break, which substantially forms two ends of the secondary winding conductor that are connected by interconnect vias to other secondary winding conductors on other layers of the PCB stack. The circularly shaped base of the secondary winding conductor 12 substantially matches the circular shape of the primary winding conductor 2. In the PCB stack, the primary winding conductor 2 shown in FIG. 2 is aligned and stacked with the secondary winding conductor 12 of FIG. 3. The dashed arc 18 shown in FIG. 3 represents the relative position of the outer perimeter edge of the primary winding conductor 2 of FIG. 2. The secondary winding conductor arms 14, 16 expand a physical area to which multiple rectifying transistors can be connected to the secondary winding conductor. The relative physical positions of select rectifying transistor are shown as superimposed boxes in FIG. 3. The rectifying transistors T422, T425, T414, T420, T416, T423, T427, T421 superimposed on FIG. 3 are mounted to one side of the PCB, for example a top side, and the remainder of the rectifying transistors T400, T424, T402, T415, T401, T417, T403, T426 (FIG. 1) are mounted to the other side of the PCB, for example a bottom side. Each rectifying transistor T422, T425, T414, T420, T416, T423, T427, T421 superimposed in FIG. 3 is vertically aligned with a corresponding one of the other rectifying transistors T400, T424, T402, T415, T401, T417, T403, T426. The rectifying transistors T422, T425, T414, T20 are connected to the inductor M400, and the rectifying transistors T416, T423, T427, T421 are connected to ground. Similarly, the rectifying transistors T400, T414, T402, T415 (FIG. 1) are connected to the inductor M400, and the rectifying transistors T401, T417, T403, T426 (FIG. 1) are connected to ground.

As shown in FIG. 3, each of the rectifying transistors is physically positioned relative to the secondary winding conductor such that a first portion of the rectifying transistor (such as portion A of rectifying transistors T416 and T423) overlaps an outer perimeter edge of the secondary winding conductor, and a second portion (such as portion B) overlaps an adjacent conductor element, such as a ground node. The position of each of the rectifying transistors connected to the secondary winding conductor is outside the footprint of the primary winding conductor, which is shown in FIG. 3 as the rectifying transistors T422, T425, T414, T420, T416, T423, T427, T421 being positioned to the right of the outer perimeter edge, such as the dashed arc 18, of the primary winding conductor 2. In such a configuration, the rectifying transistors are considered to be positioned outside of the primary current path within the primary winding conductor. In other words, the rectifying transistors are not aligned over the primary current path, which is the AC current loop.

The primary current is flowing either clockwise, such as shown in FIG. 2, or counter-clockwise around the primary winding conductor depending on the state of the primary side transistors T1-T4. A width of the primary winding conductor is a measure of the distance between the inner perimeter edge and the outer perimeter edge. The primary current flow is distributed across the width of the primary winding conductor, but is concentrated according to magnetic field lines formed by the flow path of the secondary current through the secondary winding conductor. To minimize proximity effects and eddy current loses, it is desired to have the secondary current pathways vertically aligned with the primary current pathways. However, since the rectifying transistors are physically positioned at the edge of the secondary winding conductor arms, as shown in FIG. 3, the actual secondary current paths, such as secondary current paths 20, extend into the secondary winding conductor arms so as to conduct through the rectifying transistors, for example through rectifying transistors T421, T423, T427. The distance between this extended secondary current path and the primary current path results in significant losses. In the exemplary configuration shown in FIG. 3, the portion of the secondary winding conductor outside (to the right of) the primary winding conductor accounts for about 50% of the total secondary current path. Additionally, the magnetic field lines generated by the secondary current flow in the secondary winding conductor arms results in concentrated primary current flow, proximity effect, at the outer perimeter of the primary winding conductor.

SUMMARY OF THE INVENTION

Embodiments are directed to a power conversion circuit having a multilayer transformer and a plurality of rectifying transistors coupled to the secondary windings of the multilayer transformer. The multilayer transformer is formed as multiple layers within a PCB stack, where primary winding conductors and secondary winding conductors that form the multilayer transformer are vertically aligned and stacked. The secondary winding conductors are constructed to have one or more secondary winding arms that provide area to which the plurality of rectifying transistors are physically connected. The primary winding conductors are constructed to have a primary winding arm. A footprint of each primary winding conductor is configured to substantially overlap an entire footprint of each of the secondary winding conductors. As such, an entirety of the secondary current flowing through the secondary winding conductors is vertically aligned with the primary winding conductors, and therefore with the primary current flowing through the secondary winding conductors. Vertically aligning the secondary current and the primary current within the multilayer transformer maximizes the proximity of the secondary current and the primary current, and reduces proximity effects and related eddy current loses.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a multilayer transformer structure. Those of ordinary skill in the art will realize that the following detailed description of the multilayer transformer structure is illustrative only and is not intended to be in any way limiting. Other embodiments of the multilayer transformer structure will readily suggest themselves to such skilled persons having the benefit of this disclosure.

Reference will now be made in detail to implementations of the multilayer transformer structure as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

The power converter circuit of the present application includes an enhanced multilayer transformer structure. Although the schematic layout of the power converter circuit as a whole is similar to a comparable conventional power converter circuit, the physical structural layout on the PCB is different, leading to notable enhancements and performance improvements. In particular, changes are made to the structural configuration of the primary winding conductors and the secondary winding conductors of the multilayer transformer, as well as changes to the positioning of the rectifying transistors relative to the primary winding conductors and the secondary winding conductors.

Figure 4:
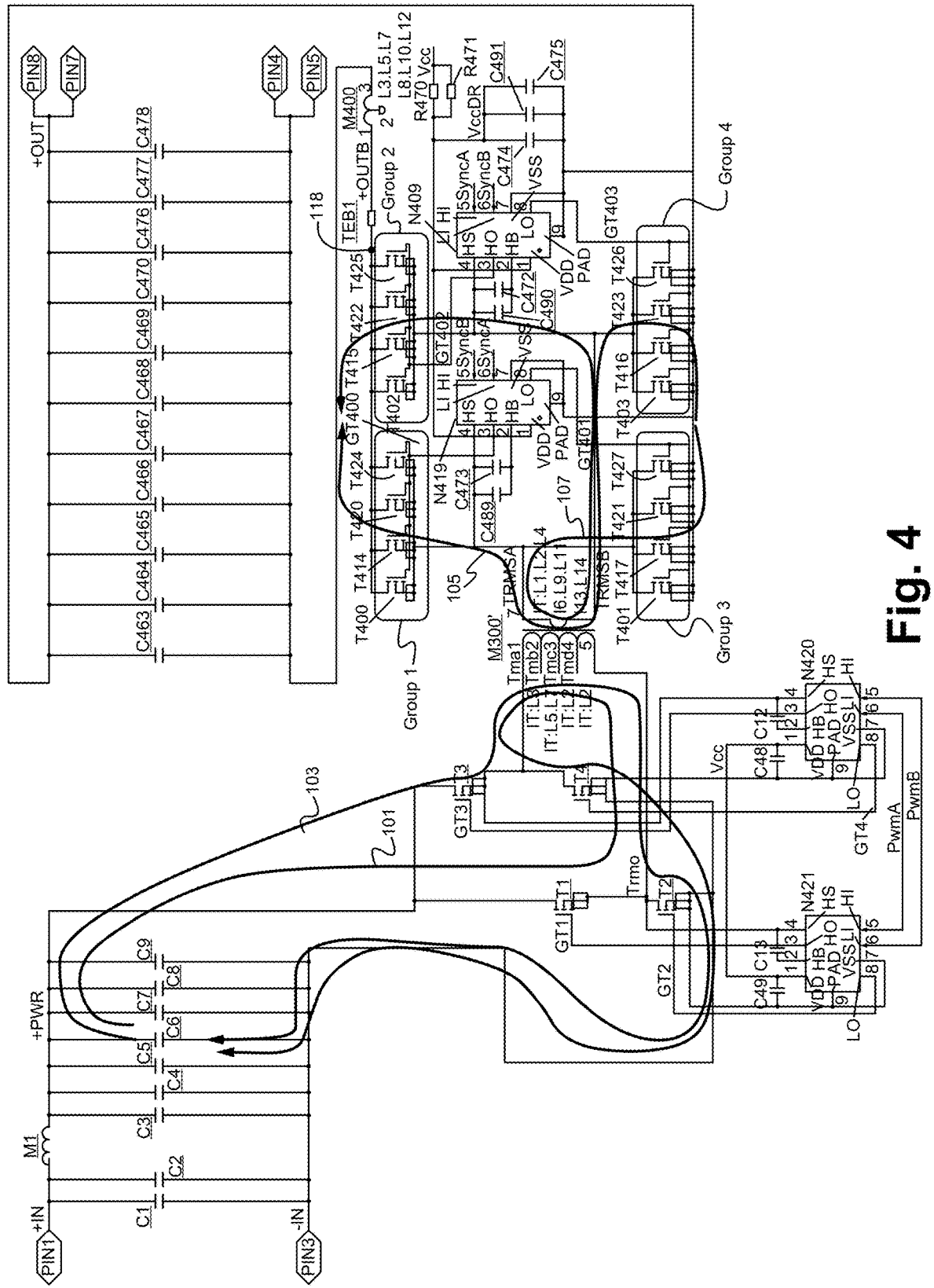
FIG. 4 illustrates a schematic diagram of an exemplary power converter circuit according to some embodiments.

FIG. 4 illustrates a schematic diagram of an exemplary power converter circuit according to some embodiments. The exemplary power converter circuit is schematic configured similarly as the power converter circuit shown in FIG. 1 for the purposes of differentiating the physical structures when comparing similar schematic layouts, as will be explained in greater detail below. It is understood that the enhanced multilayer transformer structure and corresponding rectifying transistors can be alternatively applied to other power converter circuits than the exemplary schematic shown in FIG. 4. In addition to being structural different than the comparable conventional schematic power converter circuit, the power converter circuit schematically shown in FIG. 4 includes an additional conductor element, such as a copper clip, that can be used to interconnect the secondary winding conductors to the inductor. This additional conductor element is shown as element TEB1 in FIG. 4.

Figure 1:
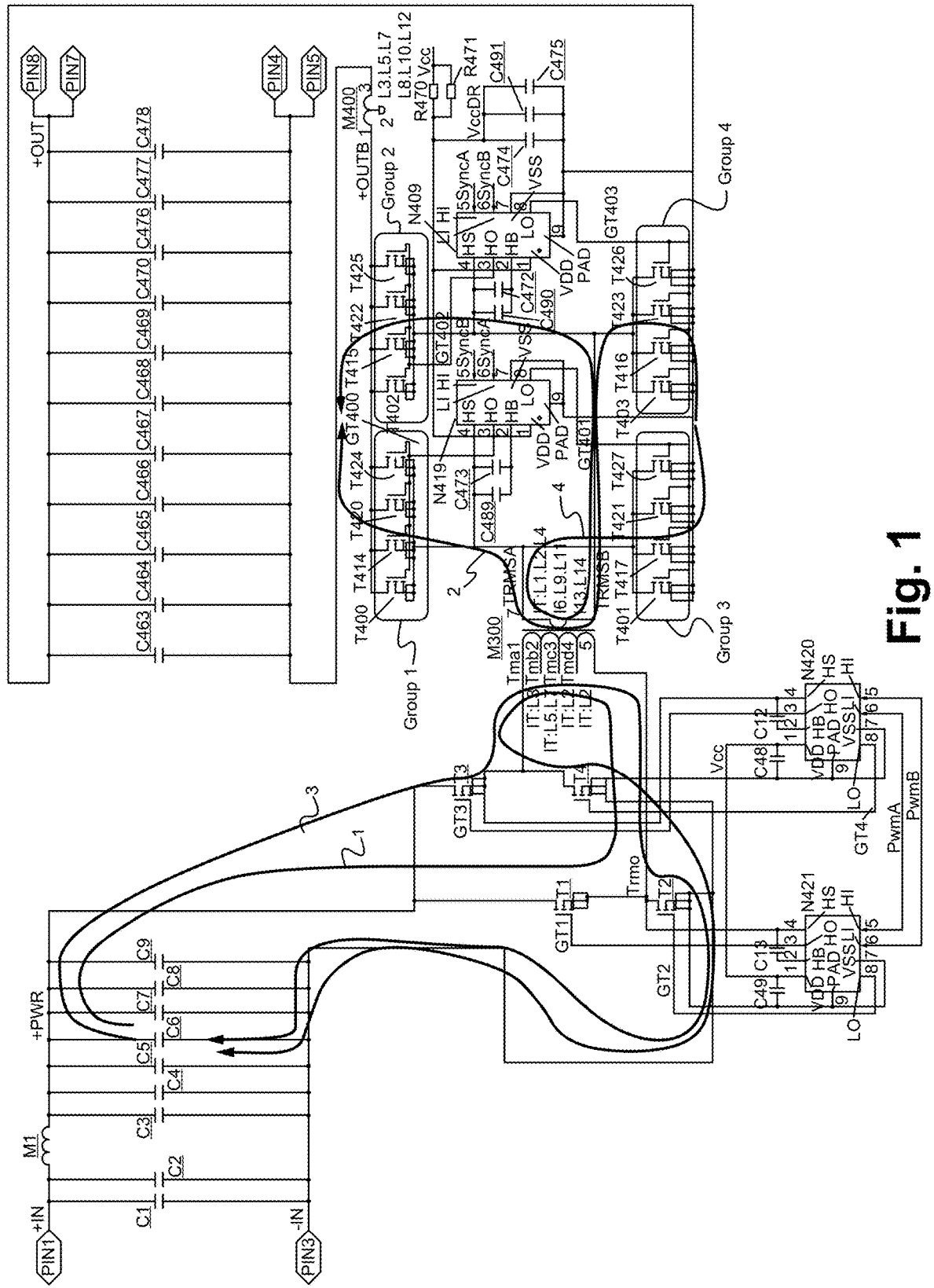
FIG. 1 illustrates a schematic diagram of an exemplary conventional power converter circuit.

The power converter circuit of FIG. 4 includes rectifying transistors T400, T414, T420, T424, T401, T417, T421, T427, configured as two groups of four transistors. The transformer M300' is a modified multilayer transformer, which is structurally different than the multilayer transformer M300 (FIG. 1). The rectifying transistors T400, T414, T420, T424, T401, T417, T421, T427 are coupled to secondary winding terminal TRMSA of the transformer M300'. The power converter circuit also includes rectifying transistors T402, T415, T422, T425, T403, T416, T423, T426, configured as two groups of four transistors. The rectifying transistors T402, T415, T422, T425, T403, T416, T423, T426 are coupled to secondary winding terminal TRMSB of the transformer M300'. Rectifying transistors T400, T414, T420, T424 are grouped together as a first group and are configured in parallel between the secondary winding terminal TRMSA and a high voltage rail +OUT_C. Rectifying transistors T402, T415, T422, T425 are grouped together as a second group and are configured in parallel between the secondary winding terminal TRMSB and the high voltage rail +OUT_C. Rectifying transistors T401, T417, T421, T427 are grouped together as a third group and are configured in parallel between the secondary winding terminal TRMSA and a ground rail. Rectifying transistors T403, T416, T423, T426 are grouped together as a fourth group and are configured in parallel between the secondary winding terminal TRMSB and the ground rail. The output side of the power converter also includes capacitors C489, C473, C490, C472, C474, C491, C475, C463-470, C476-478, resistors R470, R471, inductor M400, and rectifying transistor drivers N419, N409. The rectifying transistor drivers N419, N409 buffer and increase the drive capability of driving signals provided from a controller (not shown) for the rectifying transistors. The output voltage is provided at terminal +OUT. An input DC power is supplied at terminals +IN and −IN at an input side of the power converter circuit. The input side includes capacitors C1-C9, C12, C13, C48, C49, inductor Ml, transistors T1-T4, and transistor drivers N420, N421. The transistors T1-T4 can be MOSFETs or other conventional switching devices. The transistor drivers N420, N421 buffer and increase the drive capability of driving signals provided from a controller (not shown) for the transistors T1-T4.

The AC current has two different polarities, which requires the use of rectifying transistors for rectification. The current paths 103, 107 correspond to one phase (polarity, direction), and the current paths 101, 105 correspond to the other phase. The output of the rectifying transistors (at the DC node 118) is a rectified pulsed voltage waveform (which is an AC voltage with a single polarity), which is input to the inductor M400. Although the voltage output from the rectifying transistors is a pulsed AC voltage, the current output from the rectifying transistors is a DC current. The inductor M400 and the capacitors C463-C470. C476-C478 form an LC filter which functions to average the pulsed waveform into a substantially constant DC voltage value.

In operation, the power converter circuit receives an input DC voltage. The transistors T1-T4 are pulse width modulated so that a quasi-square voltage waveform is input to the primary winding of the transformer M300. The quasi-square voltage waveform alternates between a positive voltage pulse and a negative voltage pulse and is considered an AC voltage. Different modulation schemes can be applied. In one scheme, the transistors T1 and T4 are turned ON while the transistors T2 and T3 are turned OFF to drive current in one direction, for example negative primary current and positive secondary current, and the transistors T2 and T3 are turned ON while the transistors T1 and T4 are turned OFF when driving current in another direction, for example positive primary current and negative secondary current, which is collectively considered as AC current. When the transistors T1 and T4 are turned ON, and the transistors T2 and T3 are turned OFF, a primary current flows from the positive rail +PWR, through the transistor T1, through the primary winding of transformer M300', through the transistor T4, to the negative rail −IN, as shown in primary current path 101. During the same time period, the rectifying transistors T400, T414, T420, T424, T403, T416, T423, T426 are turned ON, and the rectifying transistors T402, T415, T422, T425, T401, T417, T421, T427 are turned OFF, which results in a secondary current flow induced at the secondary winding of the transformer M300' to flow through the rectifying transistors T400, T414, T420, T424, through the inductor M400, through the capacitors C463, C464, C465, C466, C467, C468, C469, C470, C476, C477, C478 and any connected load, through the rectifying transistors T403, T416, T423, T426, and back to the secondary winding, as shown in the secondary current path 105.

When the transistors T1 and T4 are turned OFF, and the transistors T2 and T3 are turned ON, a primary current flows from the positive rail +PWR, through the transistor T3, through the primary winding of transformer M300', through the transistor T2, to the negative rail −IN, as shown in primary current path 103. During this same time period, the rectifying transistors T400, T414, T420, T424, T403, T416, T423, T426 are turned OFF, and the rectifying transistors T402, T415, T422, T425, T401, T417, T421, T427 are turned ON, which results in a secondary current flow induced at the secondary winding of the transformer M300' to flow through the rectifying transistors T401, T417, T421, T427, through the capacitors C463, C464, C465, C466, C467, C468, C469, C470, C476, C477, C478 and any connected load, through the inductor M400, through the rectifying transistors T402, T415, T422, T425, and back to the secondary winding, as shown in the secondary current path 107. Although the current paths 101, 103, 105, 107 are schematically similar to the current paths 1, 2, 3, 4 in FIG. 1, the paths are not identical. Instead, due to the modified shapes of the primary winding conductors and the secondary winding conductors, and the different relative positions of the rectifying transistors, the current paths through the multilayer transformer M300' are different, as explained in greater detail below.

Although schematically similar to the multilayer transformer M300 of FIG. 1, the physical shape of the primary winding conductors and the secondary winding conductors of the multilayer transformer M300' are different, and the physical locations of each of the rectifying transistors T400, T414, T420, T424, T401, T417, T421, T427, T402, T415, T422, T425, T403, T416, T423, T426 relative to both the primary winding conductors and the secondary winding conductors are different.

The physical structure of the power converter circuit is implemented as a multilayer PCB. In some embodiments, the capacitors, resistors, and controller chips are mounted to a top and/or bottom side of the PCB, and the multilayer transformer is implemented as interleaved primary and secondary winding conductor layers in the PCB stack. The PCB includes patterned conductive interconnects and interconnect vias for appropriately interconnecting the various components and layers. The actual number of layers in the PCB that include a secondary winding conductor and the number of layers that include a primary winding conductor are dependent on the turns ratio of the multilayer transformer.

Figure 5:
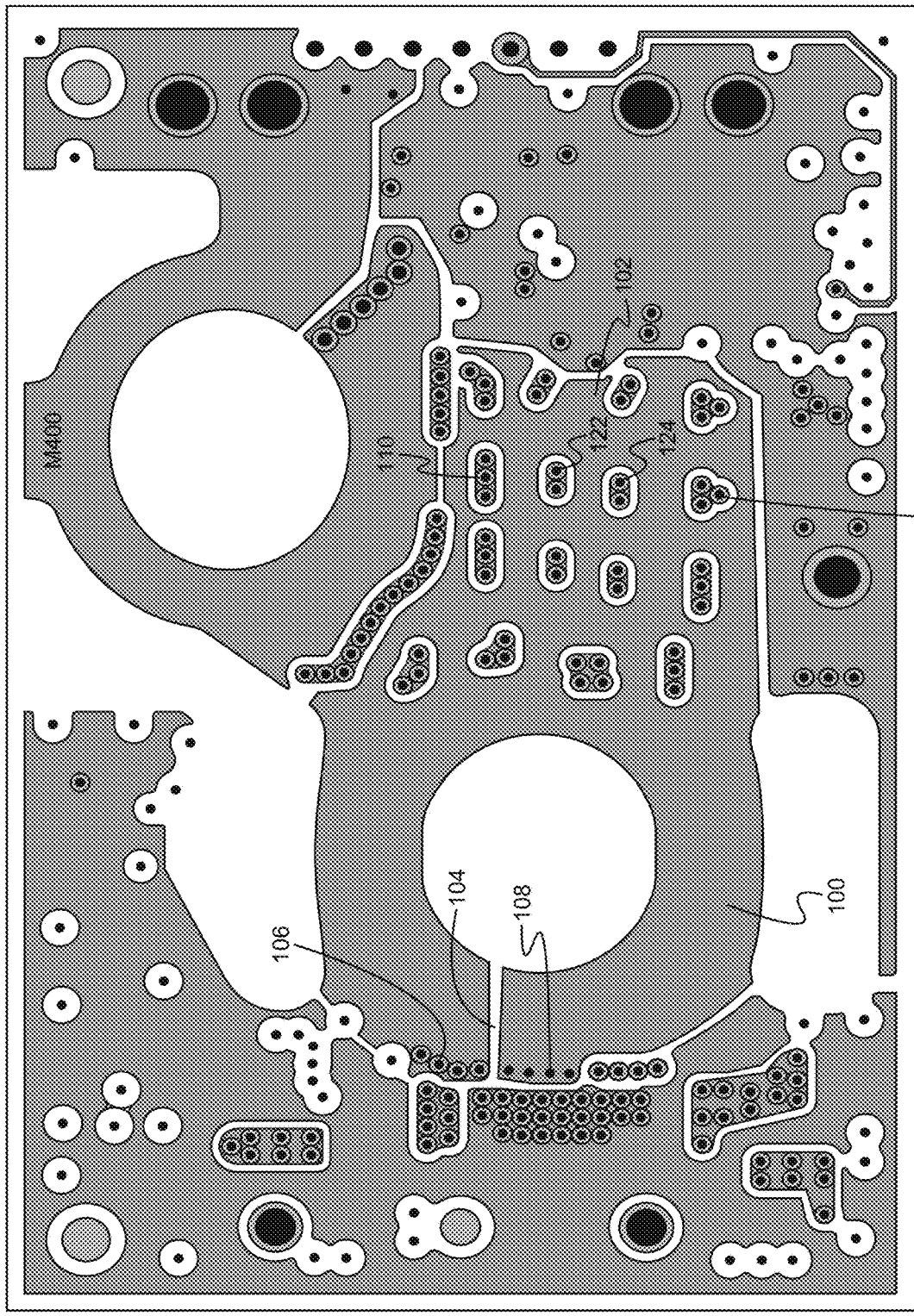
FIG. 5 illustrates a top down view of one of the layers within the PCB stack that includes a primary winding conductor according to some embodiments.

FIG. 5 illustrates a top down view of one of the layers within the PCB stack that includes a primary winding conductor according to some embodiments. The primary winding conductor 100 includes a primary winding conductor arm 102 that extends from a substantially circularly shaped base portion. The primary winding conductor 100 is discontinuous at a break 104, which forms primary winding current pathway endpoints in the particular layer of the primary winding conductor shown in FIG. 5. These endpoints can be interconnected to other adjacently positioned primary winding conductors in other layers of the PCB stack. For example, the primary winding conductor 100 can be interconnected to a next higher positioned primary winding conductor in the PCB stack using interconnect vias 106, and the primary winding conductor 100 can be interconnected to a next lower positioned primary winding conductor in the PCB stack using interconnect vias 108. The primary winding conductor 100 includes other discontinuities through which other interconnect vias can be formed to provide interconnections for secondary winding conductors interleaved with the primary winding conductors in the PCB stack. Similar discontinuities and interconnect vias can also be formed to provide interconnections to the rectifying transistors connected to the secondary winding conductors. For example, interconnects vias 110, 122, 124, 126 are formed in discontinuities of the primary winding conductor 100. Such interconnect vias are electrically disconnected from the primary winding conductor.

Figure 6:
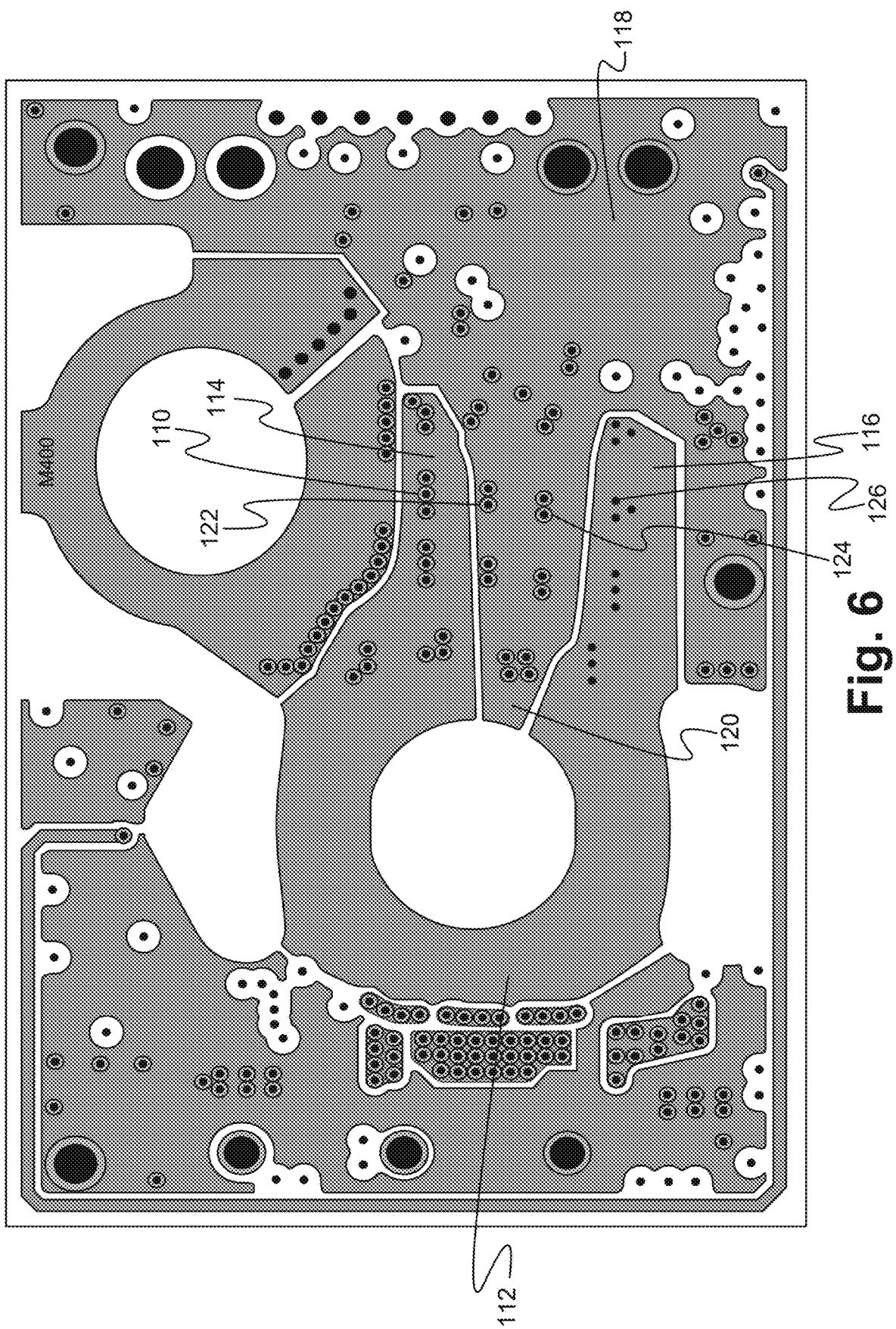
FIG. 6 illustrates a top down view of one of the layers within the PCB stack that includes a secondary winding conductor according to some embodiments.

FIG. 6 illustrates a top down view of one of the layers within the PCB stack that includes a secondary winding conductor according to some embodiments. The secondary winding conductor 112 includes a first secondary winding conductor arm 114 and a second secondary winding conductor arm 116 that extend from a circularly shaped base portion. The secondary conductor arms 114, 116 are separated by a DC node protrusion 120, which is an extension of a DC node 118. The DC node 118 is a conductor formed as part of the PCB stack layer. Each secondary winding conductor arm 114, 116 forms secondary winding current pathway endpoints in the particular layer of the secondary winding conductor shown in FIG. 6. These endpoints can be interconnected to other adjacently positioned secondary winding conductors in other layers of the PCB stack. For example, the secondary winding conductor arm 114 can be interconnected to a next higher positioned secondary winding conductor in the PCB stack using interconnect vias 110, and the secondary winding conductor arm 116 can be interconnected to a next lower positioned secondary winding conductor in the PCB stack using interconnect vias 126. The interconnect vias 110, 126 can also be formed to provide interconnections to the rectifying transistors connected to the secondary winding conductors. Interconnect vias can be coupled to the DC node protrusion to provide interconnection between the rectifying transistors and the DC node. For example, interconnect vias 122, 124 are coupled to the DC node protrusion 120.

Figure 7:
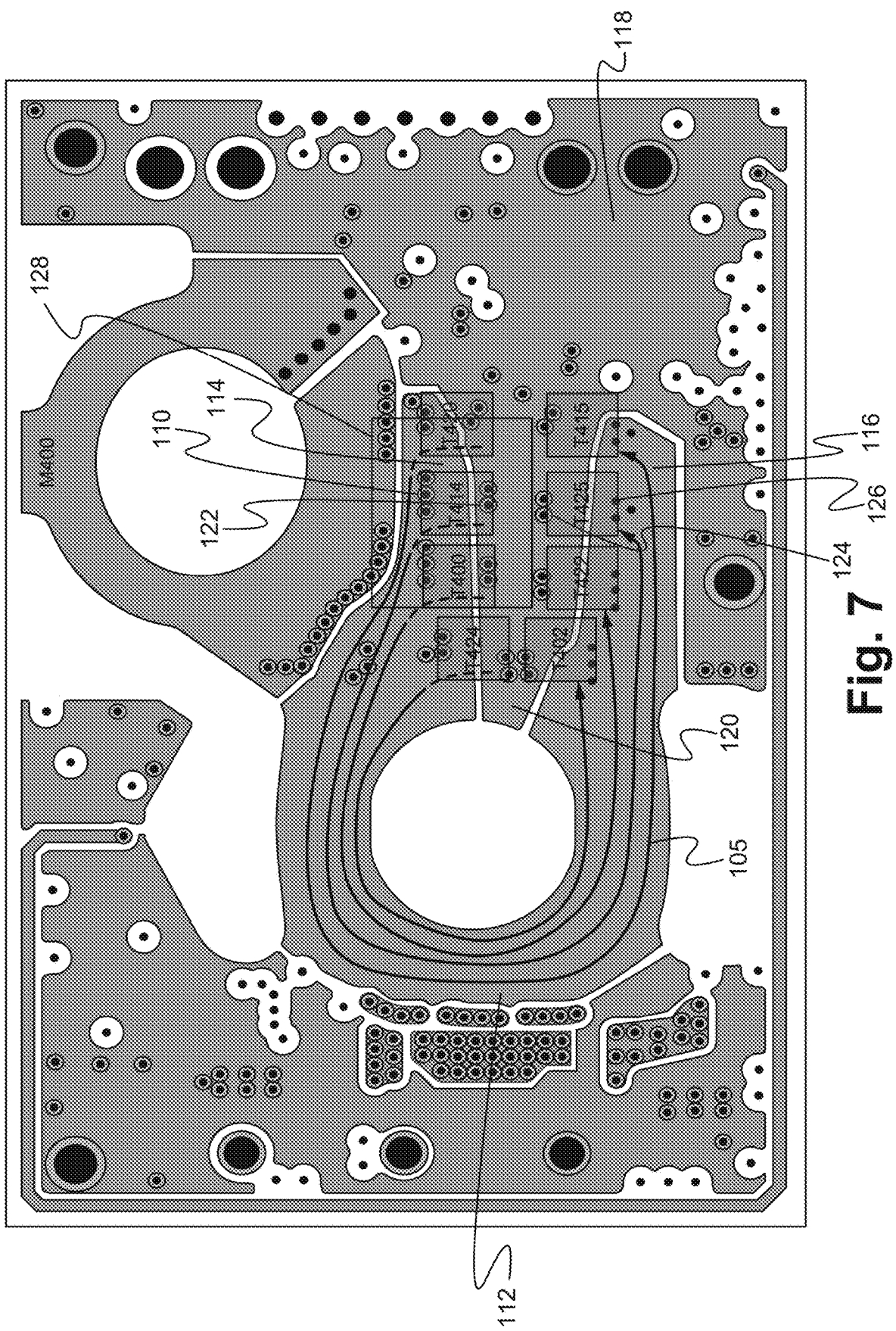
FIG. 7 illustrates the PCB stack layer from FIG. 6 that includes the secondary winding conductor 112 with a first set of rectifying transistors mounted to the top side layer of the PCB stack superimposed.
Figure 8:
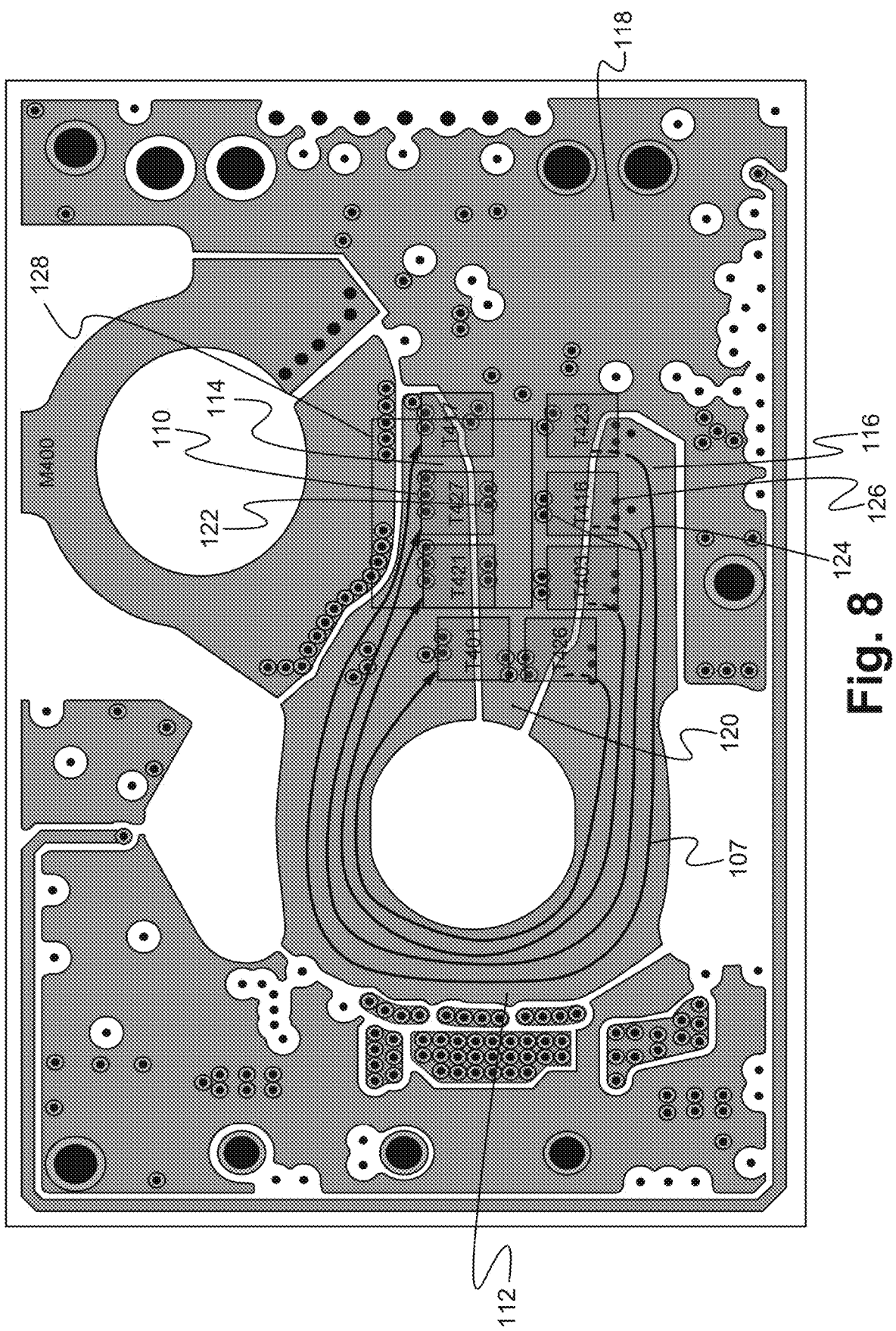
FIG. 8 illustrates the PCB stack layer from FIG. 6 that includes the secondary winding conductor 112 with a second set of rectifying transistors mounted to the bottom side layer of the PCB stack superimposed.
Figure 10:
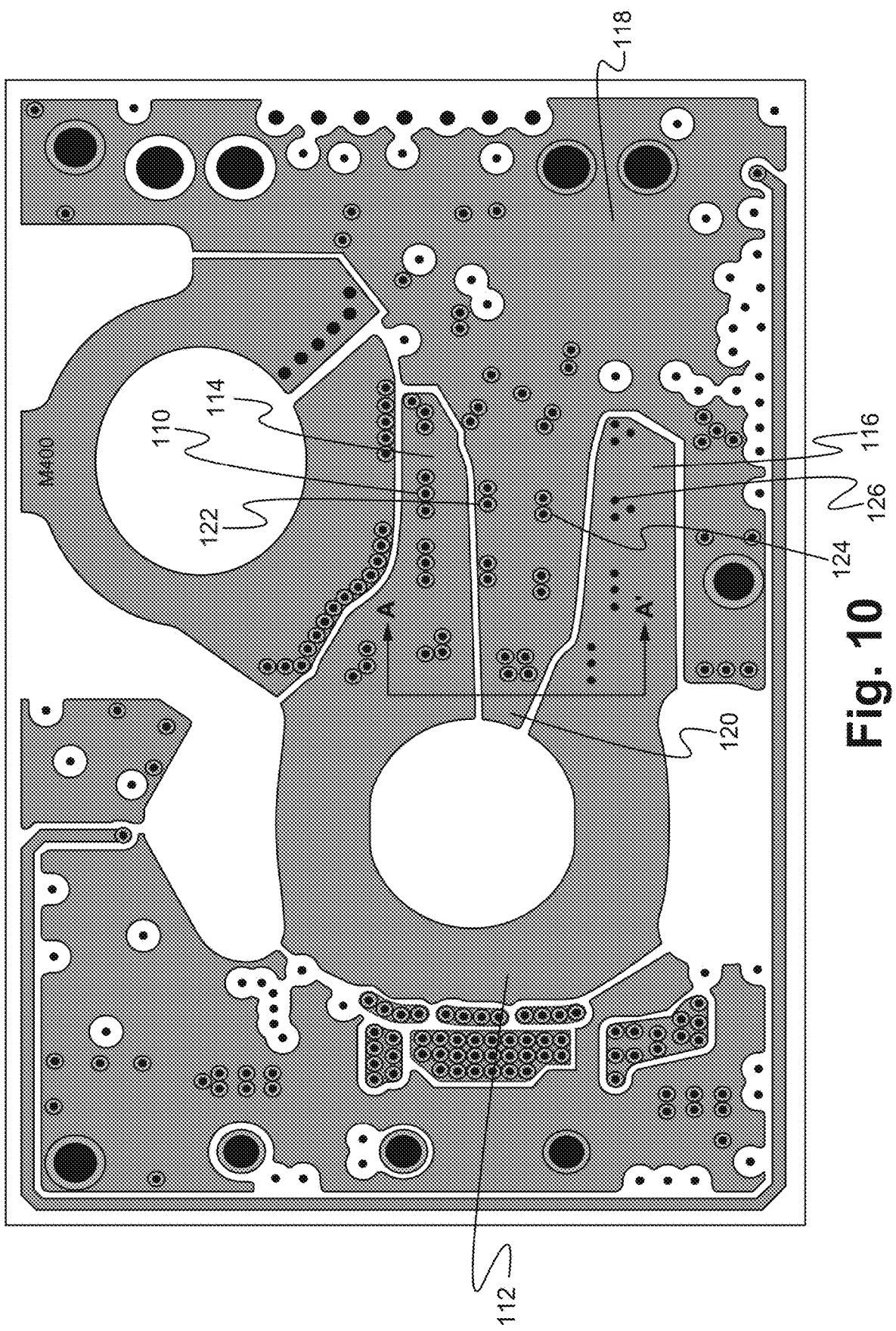
FIG. 10 illustrates the PCB stack layer from FIG. 7 indicating a cross-sectional line A-A'.
Figure 11:
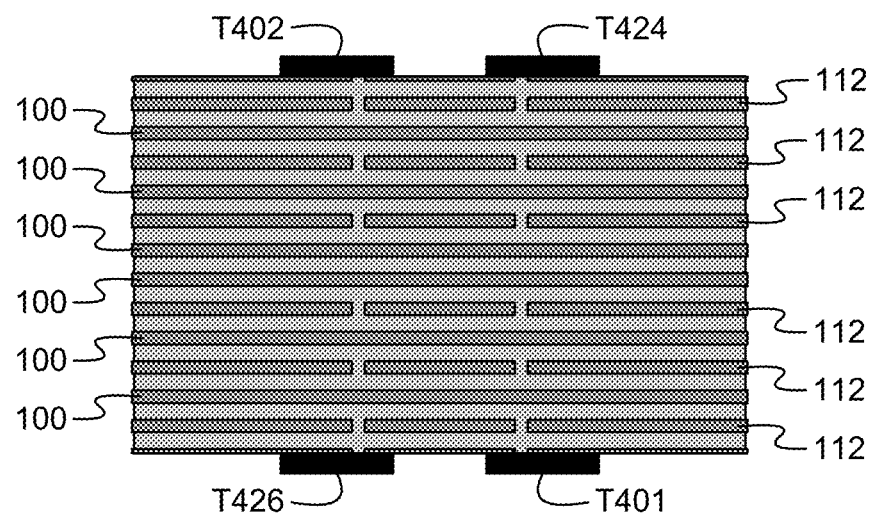
FIG. 11 illustrates a cross-sectional view of a portion of the PCB stack along line A-A', as shown in FIG. 10.
Figure 12:
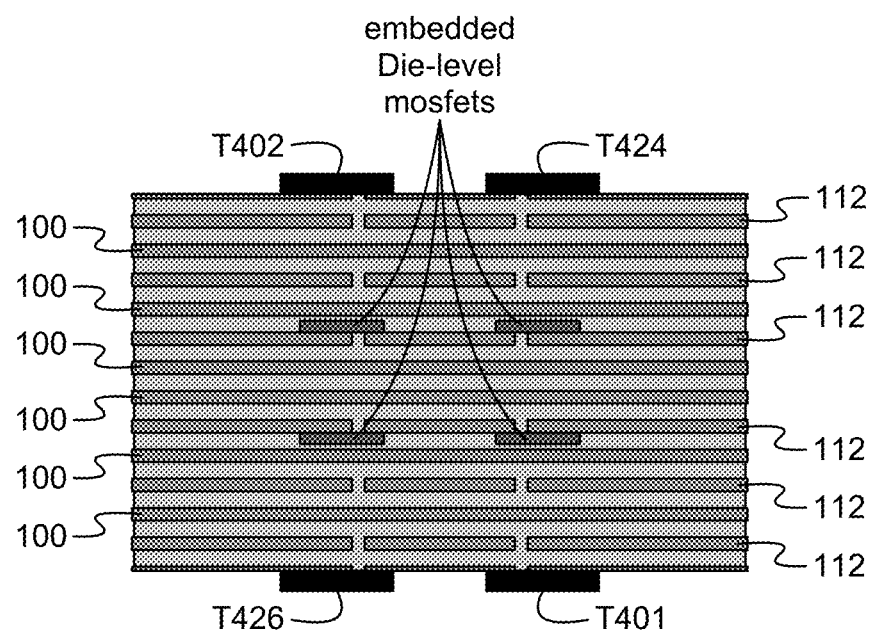
FIG. 12 illustrates a cross-sectional view of a portion of a PCB stack similar to that of FIG. 11 that also includes embedded die-level rectifying transistors.

FIG. 7 illustrates the PCB stack layer from FIG. 6 that includes the secondary winding conductor 112 with a first set of rectifying transistors mounted to the top side layer of the PCB stack superimposed. FIG. 8 illustrates the PCB stack layer from FIG. 6 that includes the secondary winding conductor 112 with a second set of rectifying transistors mounted to the bottom side layer of the PCB stack superimposed. In some embodiments, the first set of the rectifying transistors are mounted to a top side layer of the PCB stack and the second set of rectifying transistors are mounted to a bottom side layer of the PCB stack, such as shown in FIG. 11. FIG. 11 illustrates a cross-sectional view of a portion of the PCB stack along line A-A', as shown in FIG. 10. In alternative embodiments, some of the rectifying transistors can be embedded within the PCB stack, such as the exemplary cross-sectional view of a portion of a PCB stack shown in FIG. 12. The alternative embodiment shown in FIG. 12 is a similar view as that shown in FIG. 11, but with one or more of the other rectifying transistors, or additional rectifying transistors, embedded within the PCB stack and connected to corresponding secondary winding conductors.

Referring again to FIGS. 7 and 8, the first set of rectifying transistors can include the first group of rectifying transistors T400, T414, T420, T424 connected to the secondary winding terminal TRMSA and a high voltage rail +OUT_C, and the second group of rectifying transistors T402, T415, T422, T425 connected between the secondary winding terminal TRMSB and the high voltage rail +OUT_C. The first set of rectifying transistors are positioned so as to span the break between the DC node protrusion and one of the secondary winding conductor arms such that a first portion of each rectifying transistor overlaps one or the secondary winding conductor arms and a second portion of each rectifying transistor overlaps the DC node protrusion. In an exemplary configuration, the first set of the rectifying transistors are each electrically connected to a top most layer in the PCB stack that includes a secondary winding conductor. This top most layer can be the top side, outer layer of the PCB stack, or this top most layer can be an inner layer of the PCB stack. The first set of rectifying transistors can include rectifying transistors T424, T400, T414, T420, T402, T415, T422, T425. The rectifying transistors T402, T422, T425, T415 each span the break between the secondary winding conductor arm 116 and the DC node protrusion 120, and are connected to the secondary winding conductor arm 116 and the DC node protrusion 120 by corresponding interconnects and/or interconnect vias. For example, rectifying transistor T425 is connected to the secondary winding conductor arm 116 by secondary interconnect vias 126 and connected to the DC node protrusion 120 by DC node interconnects vias 124. The rectifying transistors T424, T400, T414, T420 each span the break between the secondary winding conductor arm 114 and the DC node protrusion 120, and are connected to the secondary winding conductor arm 114 and the DC node protrusion 120 by corresponding interconnects and/or interconnect vias. For example rectifying transistor T414 is connected to the secondary winding conductor arm 114 by secondary interconnect vias 110 and connected to the DC node protrusion 120 by DC node interconnects vias 122.

In some embodiments, the second set of the rectifying transistors are mounted to a bottom side layer of the PCB stack and are each electrically connected to a bottom most layer in the PCB stack that includes a secondary winding conductor. The second set of rectifying transistors can include the third group of rectifying transistors T401, T417, T421, T427 connected to the secondary winding terminal TRMSA and a ground rail, and the fourth group of rectifying transistors T403, T416, T423, T426 connected between the secondary winding terminal TRMSB and the ground rail. The second set of rectifying transistors are positioned so as to span the break between the DC node protrusion and one of the secondary winding conductor arms such that a first portion of each rectifying transistor overlaps one or the secondary winding conductor arms and a second portion of each rectifying transistor overlaps the DC node protrusion. In an exemplary configuration, the second set of the rectifying transistors are each electrically connected to a bottom most layer in the PCB stack that includes a secondary winding conductor. This bottom most layer can be the bottom side, outer layer of the PCB stack, or this bottom most layer can be an inner layer of the PCB stack. The second set of rectifying transistors can include rectifying transistors T401, T421, T427, T417, T426, T403, T416, T423. The rectifying transistors T426, T403, T416, T423 each span the break between the secondary winding conductor arm 116 and the DC node protrusion 120, and are connected to the secondary winding conductor arm 116 and the DC node protrusion 120 by corresponding interconnects and/or interconnect vias. The rectifying transistors T401, T421, T427, T417 each span the break between the secondary winding conductor arm 114 and the DC node protrusion 120, and are connected to the secondary winding conductor arm 114 and the DC node protrusion 120 by corresponding interconnects and/or interconnect vias.

Figure 3:
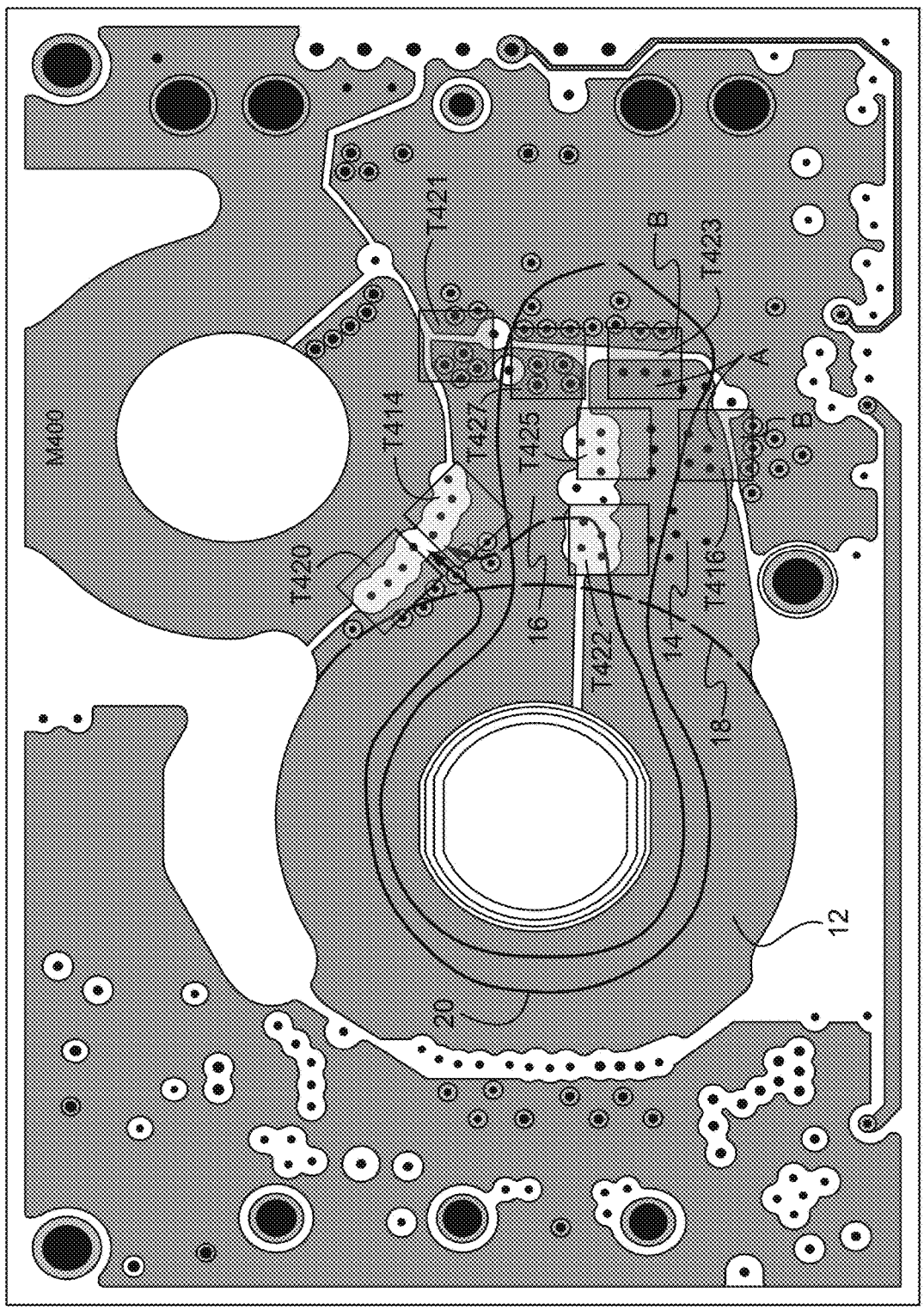
FIG. 3 illustrates a top down view of one of the layers in the conventional PCB that include a secondary winding conductor.

In some embodiments, each rectifying transistor T401, T421, T427, T417, T426, T403, T416, T423 superimposed in FIG. 8 is vertically aligned with a corresponding one of the other rectifying transistors T422, T425, T414, T420, T402, T415, T422, T425 (FIG. 7). For example, rectifying transistor T414 is positioned on the top side surface of the PCB, and rectifying transistor 427 is positioned on the bottom side surface of the PCB and aligned with rectifying transistor T414. In general, each group of parallel connected rectifying transistors connected to each transformer secondary winding are symmetrically aligned. For example, the first group of rectifying transistors is symmetrically aligned with the third group of rectifying transistors, and the second group of rectifying transistors is symmetrically aligned with the fourth group of rectifying transistors, where the first group and the second group are on a same side of the PCB stack and the third group and the fourth group are on the other side of the PCB stack. The rectifying transistors T422, T425, T414, T420, T402, T415, T422, T425 are connected to the DC node 118 of the top most layer in the PCB stack that has a secondary winding conductor. In the case where the top most layer in the PCB stack that has a secondary winding conductor is also the top side, outer layer of the PCB stack, the DC node protrusion 120 of the DC node 118 of this layer is connected to the inductor M400 by a conductor interconnect, such as a conductive clip, exemplified by the box 128 shown in FIG. 7 and by TEB1 in schematic FIG. 4. The DC current output from the rectifying transistors T422, T425, T414, T420, T402, T415, T422, T425 is input to the inductor M400 via the conductive clip 128. Although this configuration makes for a longer DC current pathway, as opposed to connecting the rectifying transistors directly from the secondary winding conductor to the inductor as in FIG. 3, the configuration of FIG. 7 provides a secondary current pathway that induces the primary current pathways of FIG. 9, as explained in detail below. The rectifying transistors T401, T421, T427, T417, T426, T403, T416, T423 on the bottom side are connected to a DC node protrusion 120 on another layer, such as a bottom most layer having a secondary winding conductor (a layer different than the layer having the DC node protrusion connected to the inductor using a copper clip), where this DC node protrusion is connected to ground.

Figure 9:
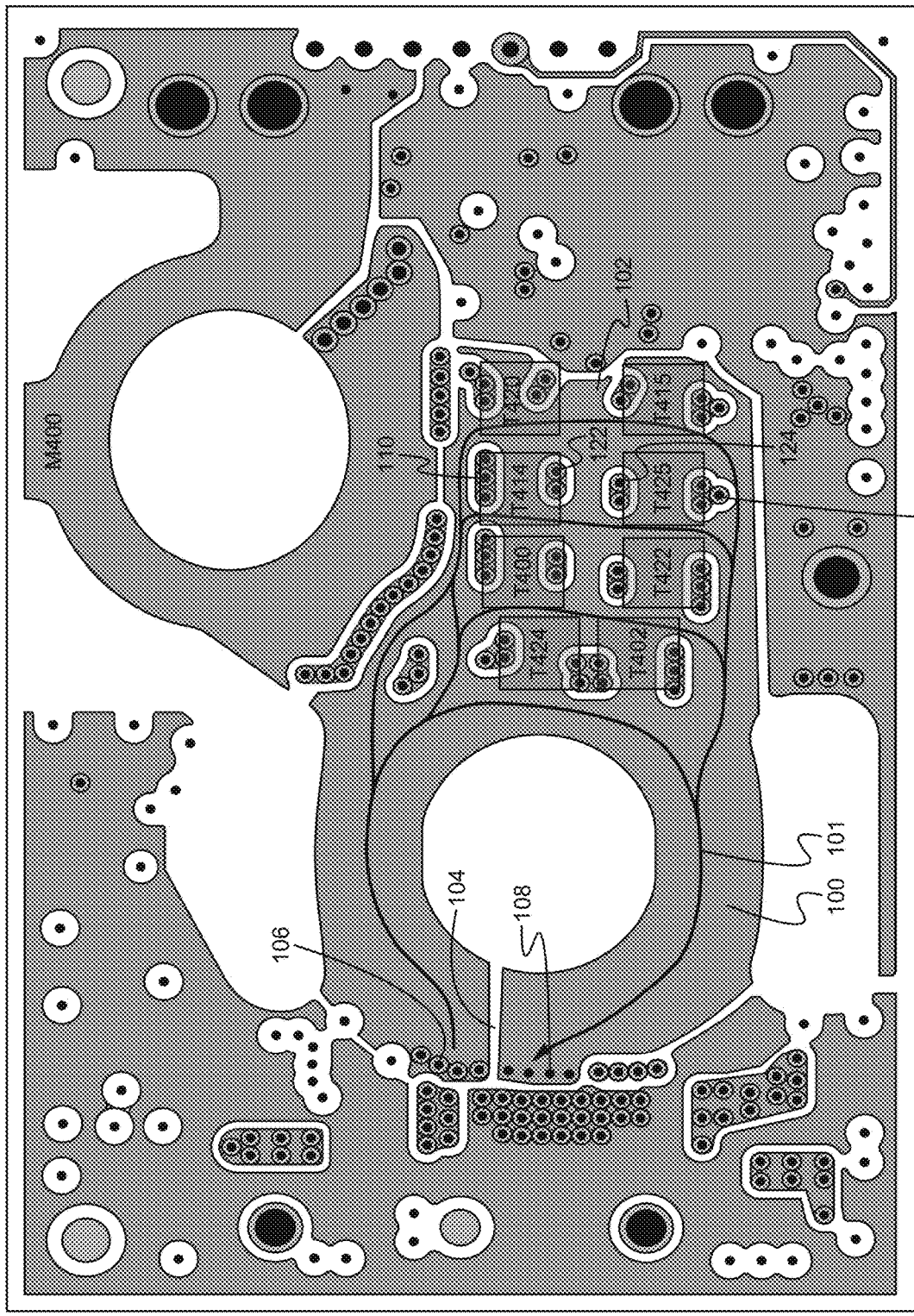
FIG. 9 illustrates the PCB stack layer from FIG. 5 that includes the primary winding conductor 100 with the rectifying transistors superimposed.

FIG. 9 illustrates the PCB stack layer from FIG. 5 that includes the primary winding conductor 100 with the rectifying transistors superimposed. As shown in FIG. 9, only the first set of rectifying transistors are labeled, but it is understood that the superimposed rectifying transistors also correspond to the second set of rectifying transistors.

In the PCB stack, the primary winding conductors 100 and the secondary winding conductors 112 in corresponding layers are vertically aligned. The primary winding conductor 100 is extended (primary winding conductor arm 102) to more closely resemble a shape of the secondary winding conductor 112 (and secondary winding conductor arms 114, 116), and in particular the primary winding conductor 100 is extended so that each rectifying transistor is completely vertically aligned over the primary winding conductor 100, as shown in FIG. 9.

The primary current flows in either clockwise, such as primary current 101 shown in FIG. 9, or counter-clockwise around the primary winding conductor 100 depending on the phase of the input AC signal. A width of the primary winding conductor 100 is a measure of the distance between the inner perimeter edge and the outer perimeter edge. The primary current flow is distributed across the width of the primary winding conductor, but is concentrated according to magnetic field lines formed by the flow path of the secondary current through the secondary winding conductor. The secondary current flows in either counter-clockwise, such as secondary current 105 shown in FIG. 7, or clockwise, such as secondary current 107 shown in FIG. 8, around the secondary winding conductor 112 depending on the direction of the primary current. The secondary current flows in an opposite direction as the primary current.

Although the secondary current is distributed across the secondary winding conductor, the secondary current is not uniformly distributed. Since the multiple rectifying transistors are positioned at different locations on the secondary winding conductor, the secondary current path becomes segmented into multiple concentrated paths, each path terminating at one of the rectifying transistors, such as the four secondary current pathways 105 shown in FIG. 7 or the four secondary current pathways 107 shown in FIG. 8. The secondary current flowing through the secondary winding conductor results in a corresponding magnetic field. The magnetic field lines are formed according to the multiple concentrated paths of the secondary current. This magnetic field in turn influences the primary current path, which is also segmented into multiple concentrated paths according to the magnetic fields. As applied to the structure shown in FIGS. 5-9, the concentrated paths of the secondary current in each secondary winding conductor that flow to each of the rectifying transistors, as shown in FIGS. 7 and 8, results in a magnetic field that effects the primary current into forming the complimentary concentrated paths in the primary winding conductor, as shown in FIG. 9. As such, the primary current path, which is distributed as concentrated paths across the extended primary winding conductor such as shown in FIG. 9, flows underneath the top side rectifying transistors and above the bottom side rectifying transistors. The secondary current path is distributed as concentrated secondary current paths that each pass through a corresponding one of the rectifying transistors, as shown in FIGS. 8 and 9. As shown in FIG. 4, the primary current path through the primary winding conductor is segmented into multiple concentrated paths. The secondary current paths shown in FIGS. 7 and 8, and the primary current paths shown in FIG. 9, are shown for exemplary purposes only. The actual secondary current paths are a function of the shape and configuration of the secondary winding conductor and the physical positioning of each of the rectifying transistor and related interconnection to the secondary winding conductor, and the primary current paths are distributed and concentrated throughout the primary winding conductor according to the localized magnetic field generated by the secondary winding paths.

All the connections between the secondary winding conductor and the rectifying transistors are occurring within the footprint of the primary current path. In other words, the primary winding conductor and the secondary winding conductor are shaped and aligned relative to each other in the PCB stack such that the rectifying transistors are positioned at locations connected to the secondary winding conductor that are vertically aligned with a portion of the primary winding conductor. This enables the primary current path, including all concentrated paths that make up the primary current path, to be vertically aligned with the rectifying transistors and the corresponding concentrated paths of the secondary current flowing through the secondary winding conductor.

Figure 2:
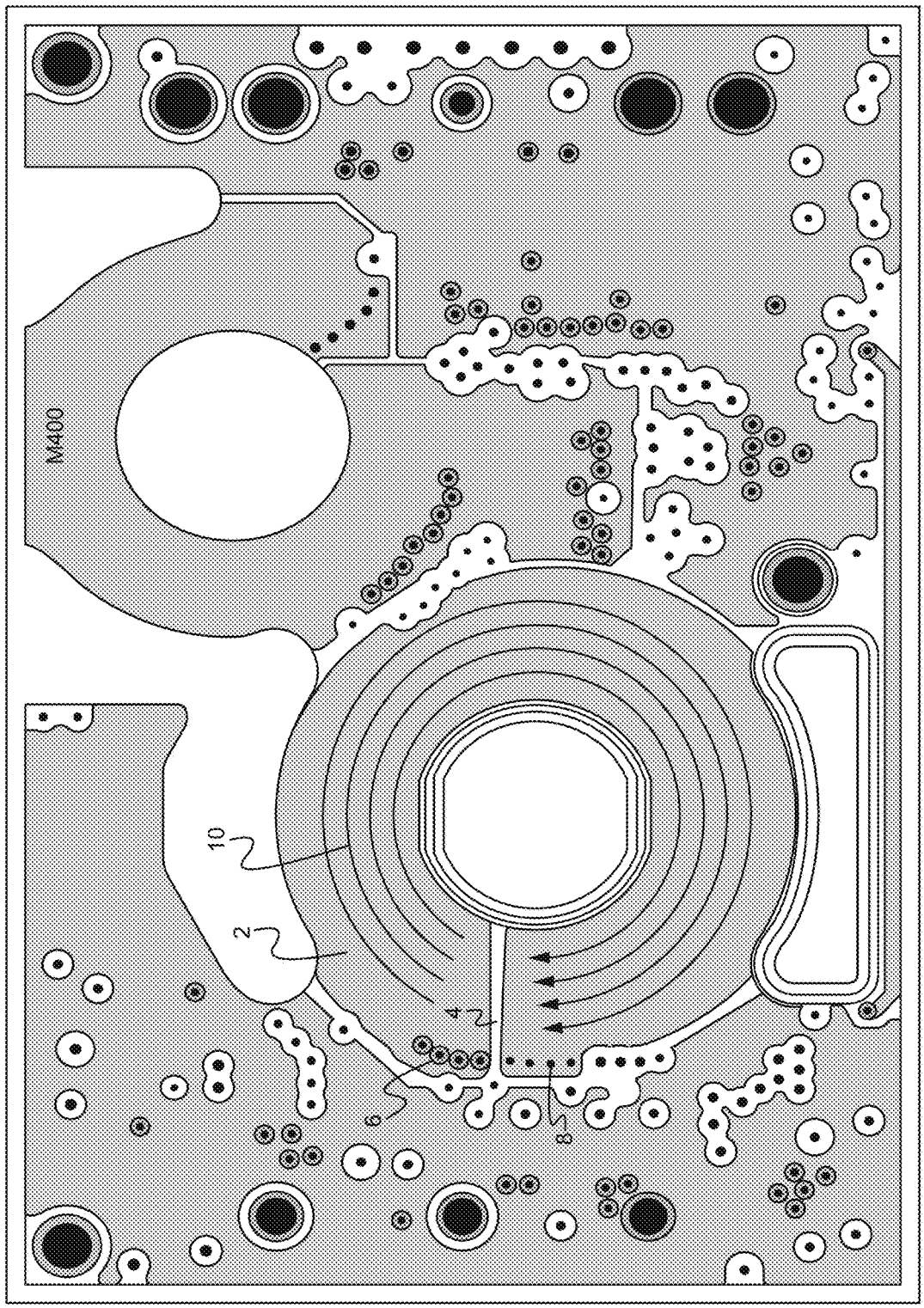
FIG. 2 illustrates a top down view of one of the layers in the conventional PCB that includes a primary winding conductor.

In those applications requiring multiple rectifying transistors connected to a high side voltage rail and multiple rectifying transistors connected to a low side voltage rail, the multilayer transformer structure described herein provides significant advantages. Configuring the primary winding conductor and the secondary winding conductor, and positioning of the rectifying transistors, in the manner shown and described results in greater current balance through the rectifying transistors since the primary current is no longer concentrated proximate the outer perimeter edge of the primary winding conductor, as in the structure of FIGS. 2 and 3. Further, vertically aligning the rectifying transistors over the primary winding conductor enables the concentrated paths of both the secondary and primary current paths to also be vertically aligned, resulting in reduced proximity effect and related eddy current loses.

Figure 13:
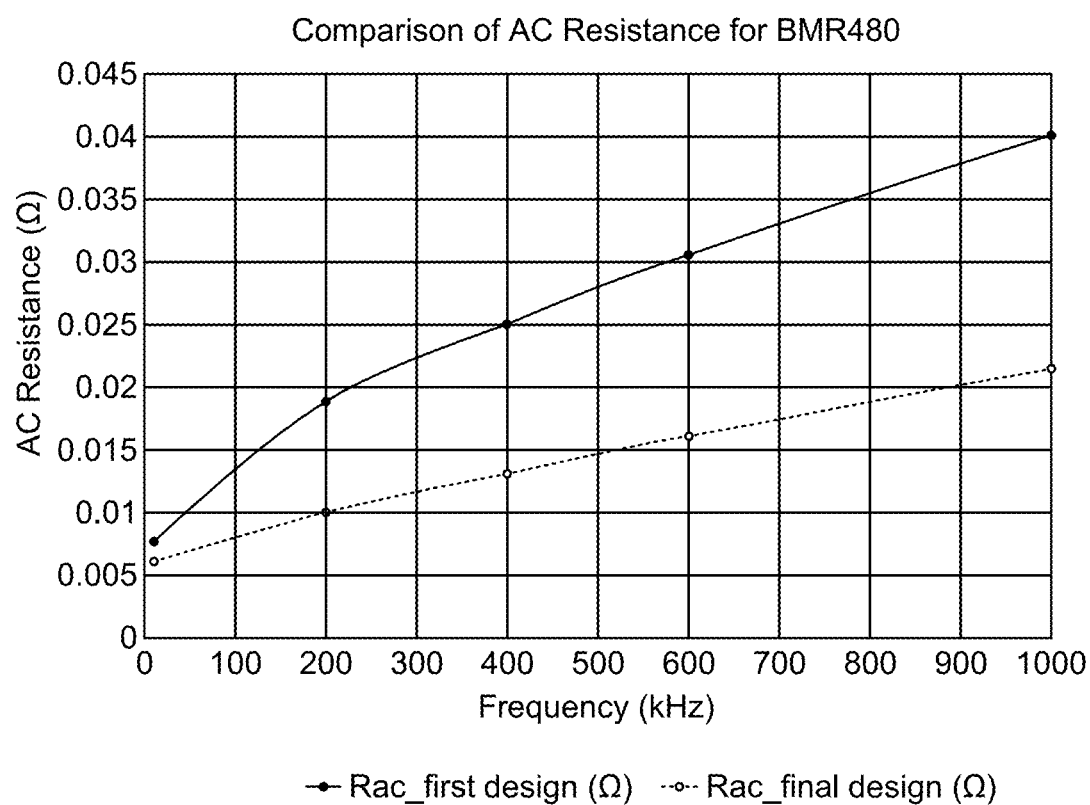
FIG. 13 illustrates a graph showing AC resistance versus frequency.

In an exemplary application, aligning the primary current path and the secondary current path in the manner described reduces the AC resistance of the transformer by approximately 50%, as shown in FIG. 13. The AC resistance is a function of both skin and proximity effects. The bottom curve shows the AC resistance versus frequency for a conventional multilayer transformer having a structure similar to that shown in FIGS. 2 and 3. The top curve shows the AC resistance versus frequency for a multilayer transformer having a structure similar to that shown in FIGS. 5-9. The gap between the two curves represents that amount of losses eliminated using the multilayer transformer structure instead of the conventional structure.

Figure 14:
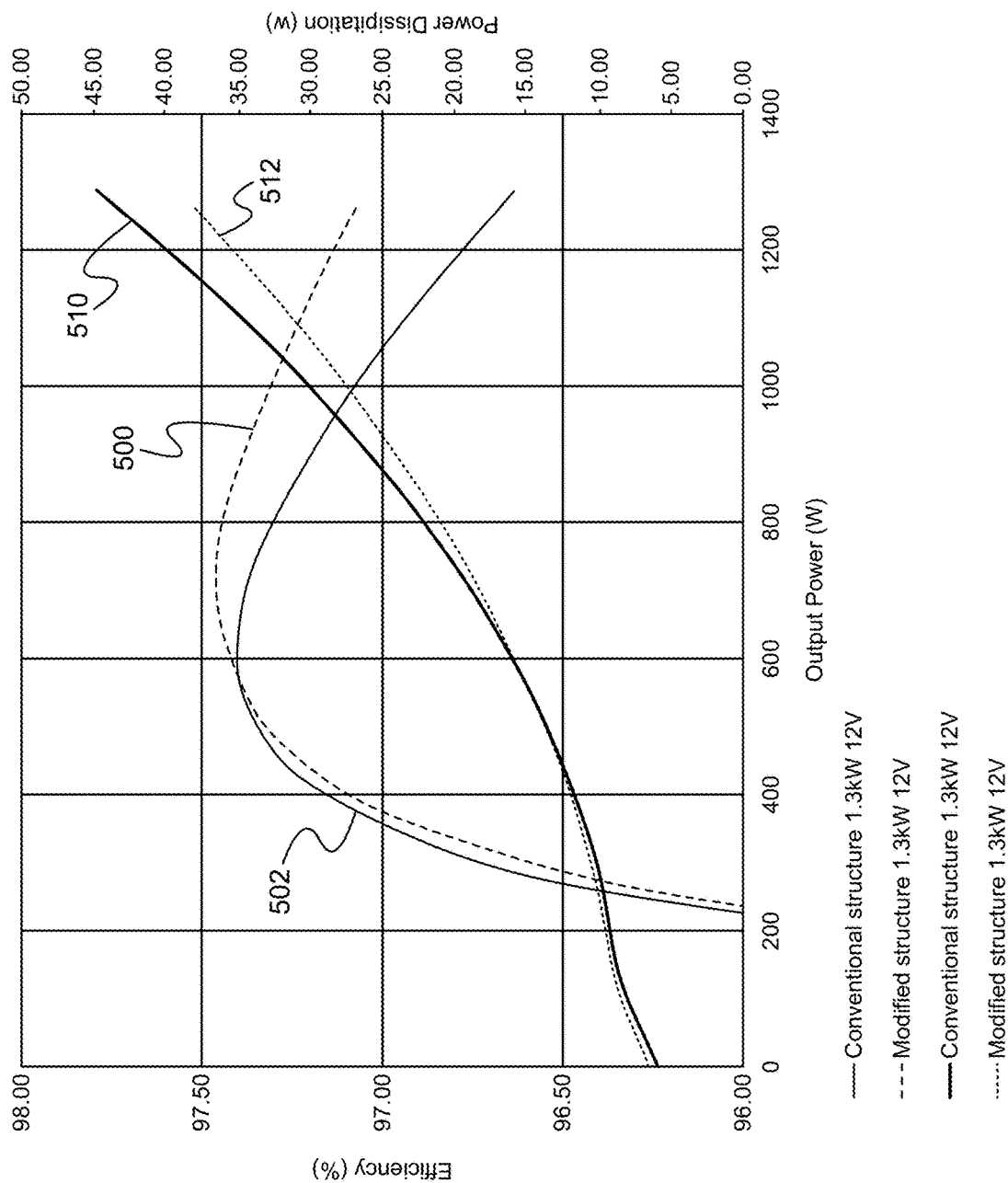
FIG. 14 illustrates a graph showing efficiency versus power.

FIG. 14 illustrates a graph showing efficiency versus power. Curves 510 and 512 show power dissipation curves, which is the input power minus the output power. In particular, curve 502 shows the power dissipation curve of a conventional power converter circuit, such as the power converter circuit of FIGS. 1-3, and curve 500 shows the power dissipation curve of the power converter circuit of the present application, such as the power converter circuit of FIGS. 4-9. The curves 500 and 502 show a ratio of the output power over the input power in percent. In particular, curve 510 shows the ratio of the output power over the input power of a conventional power converter circuit, such as the power converter circuit of FIGS. 1-3, and curve 512 shows the ratio of the output power over the input power of the power converter circuit of the present application, such as the power converter circuit of FIGS. 4-9.

Compared to a conventional power converter circuit, the circuit schematic of the power converter circuit is similar, but the layout structure of the transformer windings and relative positioning of the rectifying transistors is changed. The multilayer transformer structure enables the injection and removal of DC current into and out of the transformer block. This is enabled by configuring the DC node protrusion 120, which is connected to the rectifying transistors, to be vertically aligned with the extended portion of the primary winding conductor (primary winding conductor arm 102). Since the DC node protrusion 120 carries DC current, there is DC current within the transformer block, which is the vertical stack made up of the primary and secondary winding conductors. This multilayer transformer structure contrasts to what is typically done which is to have the rectification elements outside the vertical footprint of the multilayer transformer within the PCB stack. In this conventional configuration, AC current is injected into and removed out of the transformer block, which keeps DC current outside the transformer block.

The position of the DC protrusion enables an interconnection pathway for the output of the rectifying transistors while providing a structural configuration that enables positioning of all the rectifying transistors in the AC current path, for example rectifying transistors vertically aligned with the primary winding conductors in the PCB stack. Since secondary current flows through the rectifying transistors, the distribution of the secondary current through the secondary winding conductor is determined according to the physical positioning of the rectifying transistors. In turn, the distribution of the secondary current through secondary winding conductors, such as shown in FIGS. 7 and 8, generates magnetic field lines according the secondary current distribution. Configuring the primary winding conductors to extend at least as far so as to be vertically aligned with the rectifying transistors ensures that the magnetic field lines induce distribution the primary current pathways through the primary winding conductors to match that of the distribution of the secondary current pathways, such as shown in FIG. 6, thereby maximizing the proximity of the secondary current and the primary current, and reducing proximity effects and related eddy current loses.

The present application has been described in terms of specific embodiments incorporating details to facilitate the understanding of the principles of construction and operation of the multilayer transformer structure. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A power conversion circuit comprising:
  a. a printed circuit board stack comprising a plurality of layers stacked together;
  b. a multilayer transformer formed within the printed circuit board stack, wherein the multilayer transformer comprises a plurality of primary winding conductors and a plurality of secondary winding conductors, each primary winding conductor formed as a corresponding one layer of the printed circuit board stack and each secondary winding conductor formed as a corresponding one layer of the printed circuit board stack, further wherein a footprint of each primary winding conductor is configured to substantially vertically overlap an entire footprint of each of the secondary winding conductors; and c. a plurality of rectifying transistors, each rectifying transistor is connected to one of the plurality of secondary winding conductors.

2. The power conversion circuit of claim 1 wherein the plurality of rectifying transistors are physically located relative to the plurality of primary winding conductors to be vertically aligned with the AC current path through the multilayer transformer.

3. The power conversion circuit of claim 2 wherein the AC current path comprises a primary current path through each of the primary winding conductors.

4. The power conversion circuit of claim 1 wherein a structure of the multilayer transformer enables the injection and removal of DC current into and out of a transformer block defined as a vertical space formed by the vertically aligned and stacked plurality of primary winding conductors and plurality of secondary winding conductors.

5. The power conversion circuit of claim 1 wherein the plurality of rectifying transistors are each vertically aligned with the footprint of each primary winding conductor.

6. The power conversion circuit of claim 1 wherein each secondary winding conductor comprises a plurality of secondary winding conductor arms.

7. The power conversion circuit of claim 6 wherein each secondary winding conductor comprises a first secondary winding conductor arm and a second secondary winding conductor arm separated by a discontinuous break in the secondary winding conductor.

8. The power conversion circuit of claim 7 wherein each layer in the printed circuit board stack that includes the secondary winding conductor connected to the rectifying transistor further includes a DC node conductor, further wherein the DC node conductor includes a DC node protrusion that extends into the discontinuous break between the first secondary winding conductor arm and the second secondary winding conductor arm.

9. The power conversion circuit of claim 8 wherein the DC node protrusion is vertically aligned with each of the primary winding conductors.

10. The power conversion circuit of claim 8 wherein one or more connection points on each rectifying transistor is connected to one of the secondary winding conductors, and one or more other connection points on each rectifying transistor is connected to the DC node conductor on the same layer as the connected secondary winding conductor.

11. The power conversion circuit of claim 10 wherein the one or more other connection points on each rectifying transistor connected to the DC node conductor on the same layer as the connected secondary winding conductor are connected to the DC node protrusion.

12. The power conversion circuit of claim 8 wherein each rectifying transistor physically straddles a discontinuous break between the DC node protrusion and one of the first secondary winding conductor arm and the second secondary winding conductor arm.

13. A power conversion circuit comprising:

a. a printed circuit board stack comprising a plurality of layers stacked together;

b. a multilayer transformer formed within the printed circuit board stack, wherein the multilayer transformer comprises a plurality of primary winding conductors and a plurality of secondary winding conductors vertically aligned with the plurality of primary winding conductors; and c. a plurality of rectifying transistors, each rectifying transistor is connected to one of the plurality of secondary winding conductors, wherein a structure of the multilayer transformer enables the injection and removal of DC current into and out of a transformer block defined as a vertical space formed by the vertically aligned and stacked plurality of primary winding conductors and plurality of secondary winding conductors.

\* \* \* \* \*